United States Patent
Cui et al.

(10) Patent No.: US 12,557,571 B2
(45) Date of Patent: Feb. 17, 2026

(54) FORMING A PLANAR SEMICONDUCTOR SURFACE

(71) Applicant: The Boeing Company, Arlington, VA (US)

(72) Inventors: Shanying Cui, Calabasas, CA (US); Samuel J. Whiteley, Venice, CA (US); Jason A. Graetz, Calabasas, CA (US); John J. Vajo, West Hills, CA (US); Adam E. Sorensen, Moorpark, CA (US)

(73) Assignee: The Boeing Company, Arlington, VA (US)

(*) Notice: Subject to any disclaimer, the term of this patent is extended or adjusted under 35 U.S.C. 154(b) by 364 days.

(21) Appl. No.: 18/340,201

(22) Filed: Jun. 23, 2023

(65) Prior Publication Data

US 2024/0429041 A1 Dec. 26, 2024

(51) Int. Cl.
*H01L 21/02* (2006.01)
*H01L 21/311* (2006.01)

(52) U.S. Cl.
CPC .. *H01L 21/02167* (2013.01); *H01L 21/02576* (2013.01); *H01L 21/02579* (2013.01); *H01L 21/31111* (2013.01)

(58) Field of Classification Search
CPC ........... H01L 21/02126; H01L 21/3065; H01L 21/31116; H01L 21/31122
See application file for complete search history.

(56) References Cited

U.S. PATENT DOCUMENTS

| 11,361,964 | B2 | 6/2022 | Whiteley et al. |
| 2019/0326409 | A1* | 10/2019 | Thees ................... H10D 84/83 |
| 2023/0223268 | A1* | 7/2023 | Kang .................. H01L 21/3065 438/710 |

OTHER PUBLICATIONS

Cardenas, J. et al, "High Q SiC microresonators", Optics Express, 2013, vol. 21 No. 14, Optical Society of America.
Calusine, C. et al., "Silicon carbide photonic crystal cavities with integrated color centers", Applied Physics Letters, 2014, vol. 105 No. 011123, AIP Publishing.

(Continued)

*Primary Examiner* — Edward Chin
(74) *Attorney, Agent, or Firm* — MH2 Technology Law Group LLP

(57) ABSTRACT

A method for producing a planar semiconductor surface includes forming a workpiece that has a carrier substrate, one or more insulating layers, a semiconductor layer, a first etch stop layer, and a second etch stop layer; forming a contact on the workpiece; biasing the workpiece to a second voltage through the contact; etching the second etch stop layer and part of the first etch stop layer with a photo-electrochemical etching and the second voltage that selectively removes the second etch stop layer faster than the first etch stop layer; biasing the workpiece to a first voltage through the contact; and etching the first etch stop layer and part of the semiconductor layer with the photo-electrochemical etching and the first voltage that selectively removes the first etch stop layer faster than the semiconductor layer to produce a semiconductor device with a planar surface on the semiconductor layer.

20 Claims, 8 Drawing Sheets

(56) References Cited

OTHER PUBLICATIONS

Zielinski, M. et al., "Nitrogen doping of 3C—SiC thin films grown by CVD in a resistively heated horizontal hot-wall reactor", Journal of Crystal Growth, 2008, pp. 3174-3182, vol. 310, Elsevier B.V.

Fan, T. et al., "High-Q integrated photonic microresonators on 3C—SiC-on-Insulator (SiCOI) platform", Optics Express, Oct. 1, 2018, vol. 26 No. 20.

Wu, X. et al., "High-Q microresonators integrated with microheaters on a 3C—SiC-on-insulator platform", Optics Letters, pp. 4941-4944, vol. 44 No. 20, Oct. 15, 2019, Optical Society of America.

Falk, A.L. et al., "Polytype control of spin qubits in silicon carbide", Nature Communications, 2013, MacMillam Publishers Limited.

Calusine, G. et al., "Cavity-Enhanced Measurements of Defecr Spins in Silicon Carbide", Physical Review Applied, 2016, vol. 6, American Physical Society.

Koehl, W. et al., "Room temperature coherent control of defect spin qubits in silicon carbide", Nature. Nov. 2, 2011, vol. 479, Macmillan Publishers Limited.

Song, B.S. et al., "Ultrahigh-Q photonic crystal nanocavities based on 4H silicon carbide", Optica, 2019, vol. 6, No. 8, Optical Society of America.

Shor, J.S. et al., "Photoelectrochemical conductivity selective etch stops for SiC", Applied Physics Letters, 1992, pp. 1001-1003, vol. 60, American Institute of Physics.

Shishkin, Y. et al., "Photoelectrochemical Etching of n-type 4H silicon carbide", Journal of Applied Physics, Aug. 15, 2004, pp. 2311-2322, vol. 96, No. 4, American Institute of Physics.

Wolfowicz, G. et al., "Optical charge state control of spin defects in 4H—SiC", Nature Communications, vol. 8., Nov. 2017.

Jeong, J.K. et al., "Homoepitaxial growth of 6H—SiC thin films by metal-organic chemical vapor deposition using bis-trimethylsilymethane precursor", Journal of Crystal and Growth, 2000, pp. 629-636, vol. 210, Elsevier Science B.V.

Magyar, A.P. et al., "High quality SiC microdisk resonators fabricated from monolithic epilayer wafers", Applied Physics Letters, 2014, vol. 104 No. 051109, AIP Publishing.

Bracher, D.O., et al., "Fabrication of High-Q Nanobeam Photonic Crystals in Epitaxially Grown 4H—SiC", Nane Letters, 2015, pp. 6202-6207, vol. 15, American Chemical Society.

Bracher, D.O. et al., "Selective Purcell enhancement of two closely linked zero-phonon transitions of silicon catbide color center", PNAS, Apr. 18, 2017, pp. 4060-4065, vol. 114, No. 16.

Cardenas, J. et al., "Optical nonlinearities in high-confinement silicon carbide waveguides", Optics Letters, Sep. 1, 2015, pp. 4138-4141, vol. 40, No. 17, Optical Society of America.

Zheng, Y. et al., "High-quality factor high-continement microing resonators in 4H-silicon carbide-on-insulator", Optics Express, Apr. 29, 2019, vol. 27, No. 9, Optical Society of America.

Whiteley, S. et al., "Dopant Selective Photoelectrochemical Etching of SiC", Journal of The Electrochemical Society, 2023, vol. 170, IOP Publishing Limited.

\* cited by examiner

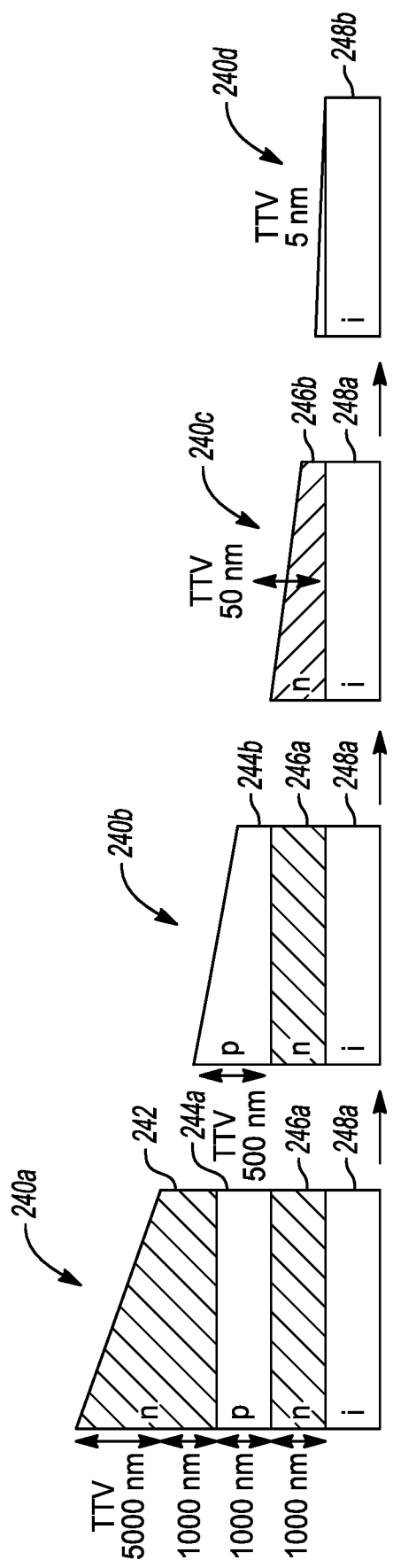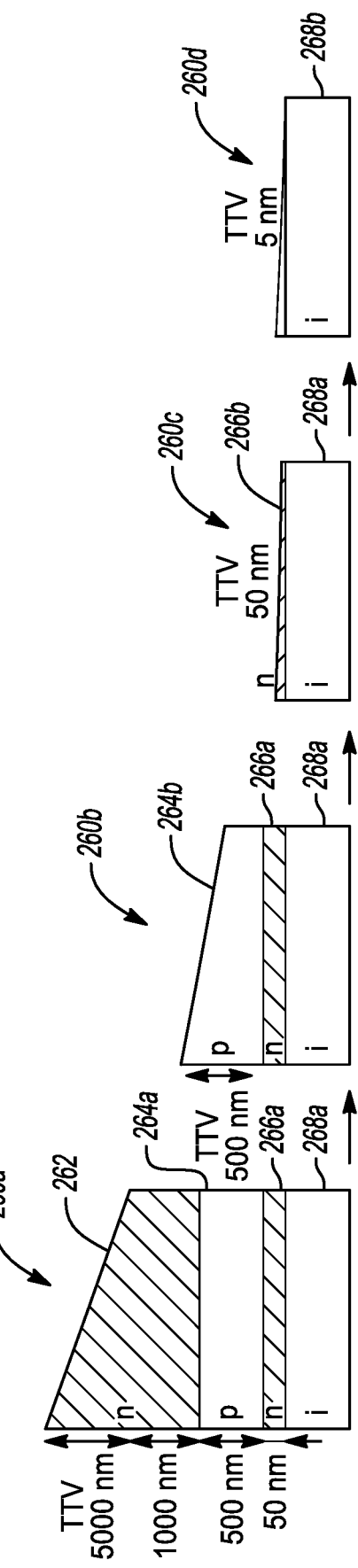

FORMING A PLANAR SEMICONDUCTOR SURFACE

TECHNICAL FIELD

The disclosure relates generally to semiconductor fabrication, and in particular, to techniques for forming a planar semiconductor surface.

BACKGROUND

Wide-gap semiconductors are used in commercial devices such as blue light-emitting diodes, micro-electromechanical systems (MEMS), and high-frequency and high-power electronics. However, the wide-gap semiconductors do not grow defect-free single crystals on common, low-cost substrates, such as silicon and silicon oxide, due to lattice mismatches. The defects limit the use of the wide-gap semiconductors as thin films for integrated photonic devices (both linear and nonlinear) and low-loss electro-optical devices. Current methods for fabricating optically and electrically isolated thin films from the materials either yield poor crystal quality or have nonuniform film surfaces across a wafer.

Accordingly, those skilled in the art continue with research and development efforts in the field of developing wide-gap semiconductor materials with uniform surfaces.

SUMMARY

A method for producing a planar semiconductor surface is provided herein. The method includes forming a workpiece that has a carrier substrate, one or more insulating layers on the carrier substrate, a semiconductor layer on the one or more insulating layers, a first etch stop layer on the semiconductor layer, and a second etch stop layer on the first etch stop layer; forming a contact on the workpiece; biasing the workpiece to a second voltage through the contact; etching the second etch stop layer and part of the first etch stop layer with a photo-electrochemical etching and the second voltage that selectively removes the second etch stop layer faster than the first etch stop layer; biasing the workpiece to a first voltage through the contact, where the first voltage is different than the second voltage; and etching the first etch stop layer and part of the semiconductor layer with the photo-electrochemical etching and the first voltage that selectively removes the first etch stop layer faster than the semiconductor layer to produce a semiconductor device with a planar surface on the semiconductor layer.

In one or more embodiments of the method, the workpiece has a third etch stop layer on the second etch stop layer. The method further includes biasing the workpiece to a third voltage through the contact, where the third voltage is different than the second voltage; and etching the third etch stop layer and part of the second etch stop layer with the photo-electrochemical etching and the third voltage that selectively removes the third etch stop layer faster than the second etch stop layer.

In one or more embodiments of the method, the semiconductor layer is an intrinsic layer.

In one or more embodiments, the method includes forming the semiconductor layer on the first etch stop layer.

In one or more embodiments, the method includes forming the first etch stop layer with a first doping type; and forming the second etch stop layer with a second doping type, where the first doping type is different than the second doping type.

In one or more embodiments, the method includes forming the first etch stop layer with a first doping concentration; and forming the second etch stop layer with a second doping concentration, where the second doping concentration is lower than the first doping concentration.

In one or more embodiments of the method, the first doping concentration and the second doping concentration are in a range of approximately $1 \times 10^{18}$ dopants per cubic centimeters to approximately $1 \times 10^{17}$ dopants per cubic centimeters.

In one or more embodiments, the method includes forming the first etch stop layer with a first thickness; and forming the second etch stop layer with a second thickness, where the second thickness is greater than the first thickness.

In one or more embodiments of the method, the first thickness and the second thickness are in a range of approximately 10 nanometers to approximately 10 micrometers.

In one or more embodiments, the method includes measuring an etch current through the contact during the photo-electrochemical etching.

In one or more embodiments, the method includes setting a bias voltage used in the photo-electrochemical etching to less than 0.2 volts from a peak voltage at which a peak etch current is measured through the contact.

In one or more embodiments of the method, the second etch stop layer is an n-type silicon carbide, the first etch stop layer is a p-type silicon carbide, and the second voltage used in the photo-electrochemical etching is higher than a peak voltage that creates a peak etch current for the p-type silicon carbide such that the p-type silicon carbide is passivated and stops etching.

In one or more embodiments of the method, the etch current drops in response to etching through the second etch stop layer.

In one or more embodiments of the method, the planar surface on the semiconductor layer varies by no greater than 10 nanometers over a 100 millimeter diameter wafer.

In one or more embodiments, the method includes forming the workpiece on a sacrificial substrate.

In one or more embodiments, the method includes removing the sacrificial substrate before the forming of the contact.

A semiconductor device with a planar surface fabricated is provided herein. The semiconductor device is fabricated by a method that includes forming a workpiece that has a carrier substrate, one or more insulating layers on the carrier substrate, a semiconductor layer on the one or more insulating layers, a first etch stop layer on the semiconductor layer, and a second etch stop layer on the first etch stop layer; forming a contact on the workpiece; biasing the workpiece to a second voltage through the contact; etching the second etch stop layer and part of the first etch stop layer with a photo-electrochemical etching and the second voltage that selectively removes the second etch stop layer faster than the first etch stop layer; biasing the workpiece to a first voltage through the contact, where the first voltage is different than the second voltage; and etching the first etch stop layer and part of the semiconductor layer with the photo-electrochemical etching and the first voltage that selectively removes the first etch stop layer faster than the semiconductor layer to produce a semiconductor device with a planar surface on the semiconductor layer.

A method for producing a planar semiconductor surface is provided herein. The method includes forming a workpiece that has a carrier substrate, a semiconductor layer, a first etch stop layer on the semiconductor layer, a second etch stop layer on the first etch stop layer, and a sacrificial substrate on the second etch stop layer; removing the sacrificial substrate;

forming a contact on the workpiece after the sacrificial substrate has been removed; biasing the workpiece to a second voltage through the contact; etching the second etch stop layer and part of the first etch stop layer with a photo-electrochemical etching and the second voltage that selectively removes the second etch stop layer faster than the first etch stop layer; biasing the workpiece to a first voltage through the contact, where the first voltage is different than the second voltage; and etching the first etch stop layer and part of the semiconductor layer with the photo-electrochemical etching and the first voltage that selectively removes the first etch stop layer faster than the semiconductor layer to produce a semiconductor device with a planar surface on the semiconductor layer.

In one or more embodiments, the method includes forming the semiconductor layer on the first etch stop layer.

In one or more embodiments, the method includes forming the first etch stop layer with a first doping type; and forming the second etch stop layer with a second doping type, where the first doping type is different than the second doping type.

The above features and advantages, and other features and advantages of the present disclosure are readily apparent from the following detailed description of the best modes for carrying out the disclosure when taken in connection with the accompanying drawings.

BRIEF DESCRIPTION OF THE DRAWINGS

FIG. 11 is a schematic cross-sectional diagram of total thickness variation reduction using alternating n-type and p-type layers in accordance with one or more exemplary embodiments.

FIG. 12 is a schematic cross-sectional diagram of total thickness variation reduction using sacrificial etch layers with variable thickness in accordance with one or more exemplary embodiments.

DETAILED DESCRIPTION

Embodiments of the present disclosure include a method for producing and/or semiconductor device that has a planar surface. For photonic structures, a <10 nanometer (nm) total thickness variation (TTV) over a 100 millimeter diameter wafer is appropriate for both linear and nonlinear optical components on a chip. In various embodiments, a series of alternating dopant level etch stop layers allow for a reduction in total thickness variation during photo-electrochemical etching compared to etching of a single doped layer while using only modest (e.g., 10:1) etch selectivity for each layer.

Single-crystalline 4H—SiC (silicon carbide) is a wide-gap semiconductor with optical properties suitable for new applications in micro-electromechanical systems (MEMS) and quantum devices. Ultraviolet photo-electrochemical processing of silicon carbide provides suitable dopant-type selectivity and the advantage of multiple etch stops to reduce layer thickness variation. Dopant-based selective etching provides a greater than 100 times reduction in surface variation by combining multiple (e.g., two or more) etch stops to produce a final smooth surface in a semiconductor layer. Moreover, an etch rate of greater than 4 micrometers ($\mu$m) per hour through the etch stop layers may be achieved. The final surface is unusually smooth (e.g., approximately 1 nm root mean square). Therefore, a scalable path to the fabrication of precise nanoscale silicon carbide structures and electronic devices may enable the next generation of MEMS and photonic quantum devices. In particular, the devices include quantum networking with isolated optically active defects combined with on-chip photonic signaling, efficient optical frequency converters, entangled photon sources with nonlinear crystals, superconducting single photon detectors, and photonic devices with isolated spin defects that may be used in quantum memories for quantum information processing.

Figure 1:
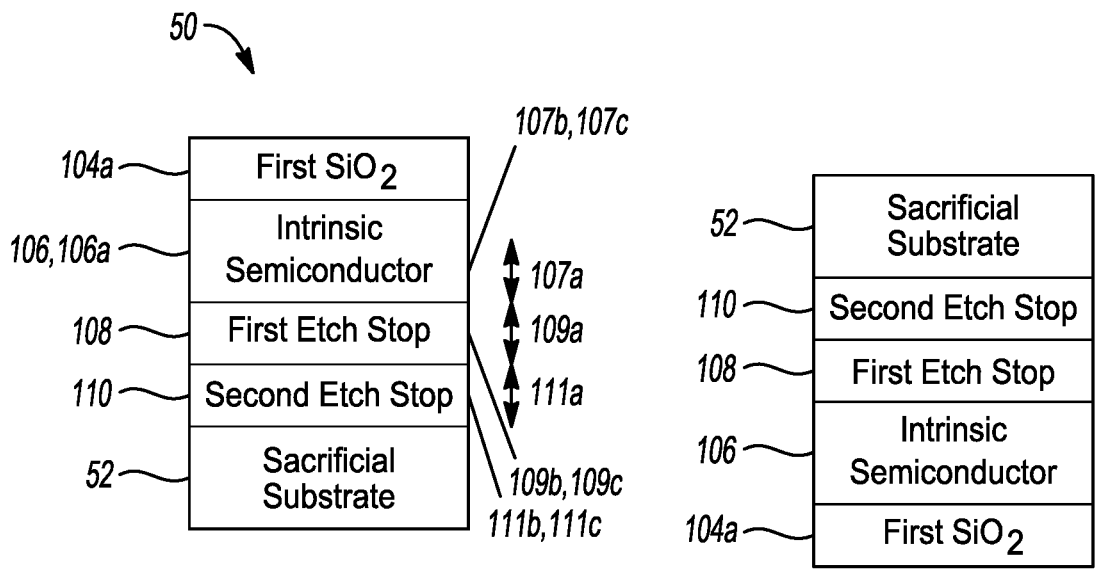
FIG. 1 is a schematic cross-sectional diagram of an initial stacked device in accordance with one or more exemplary embodiments.

Referring to FIG. 1, a schematic cross-sectional diagram of an example implementation of an initial stacked device 50 is shown in accordance with one or more exemplary embodiments. The initial stacked device 50 generally includes a sacrificial substrate 52, a second etch stop layer 110, a first etch stop layer 108, a semiconductor layer 106, and first insulating layer 104a.

The sacrificial substrate 52 implements a 4H—SiC wafer. The sacrificial substrate 52 has a wafer normal miscut of approximately 4 degrees or other small angle off-axis angle from the (0001) crystal direction. In various embodiments, the sacrificial substrate 52 may have a diameter of approximately 3 inches to approximately 6 inches (e.g., 4 inches or 100 millimeters (mm)). The sacrificial substrate 52 generally exhibits an initial total thickness variation of approximately 1-3 $\mu$m. The 4H—SiC may be an n-type semiconductor. Other types of silicon carbide crystals and dopants may be implemented in the sacrificial substrate 52 to meet the design criteria of a particular application.

The second etch stop layer 110 implements a doped epitaxial layer of 4H—SiC. The second etch stop layer 110 is formed on the sacrificial substrate 52. A second thickness 111a of the second etch stop layer 110 is in a general range of approximately 500 nm to approximately 10,000 nm (e.g., 6,000 nm). A second doping type 111b in the second etch stop layer 110 may be an n-type dopant. A doping concentration 111c may be in a range of approximately $1\times10^{16}$ dopants per centimeter (cm)$^3$ to approximately $1\times10^{20}$ dopants per cm$^3$ (e.g., $1\times10^{19}$ cm$^{-3}$). The second etch stop layer 110 becomes a sacrificial portion of material during the fabrication process.

The first etch stop layer 108 implements a doped epitaxial layer of 4H—SiC. The first etch stop layer 108 is formed on the second etch stop layer 110. A first thickness 109a of the first etch stop layer 108 is in a general range of approximately 500 nm to approximately 10,000 nm (e.g., 1,000 nm). A first doping type 109b in the first etch stop layer 108 may be a p-type dopant. A doping concentration 109c may be in a range of approximately $1\times10^{16}$ dopants/centimeters (cm)$^3$ to approximately $1\times10^{20}$ cm$^{-3}$ (e.g., $1\times10^{17}$ cm$^{-3}$). The first etch stop layer 108 becomes a sacrificial portion of material during the fabrication process.

The semiconductor layer 106 implements another epitaxial layer of 4H—SiC. The semiconductor layer 106 may be considered a working layer in which devices are subsequently fabricated. In various embodiments, the semiconductor layer 106 may be an intrinsic layer 106a. In other embodiments, the semiconductor layer 106 may be a doped n-type 107b with a light dopant concentration 107c (e.g., $1\times10^{17}$ dopants cm$^{-3}$). A thickness 107a of the semiconductor layer 106 is in a general range of approximately 200 nm to approximately 2,000 nm (e.g., 1,000 nm). In various embodiments, the n-type and the p-type layers may be reversed such that the semiconductor layer 106 and the second etch stop layers are p-type layers and the first etch stop layer 108 is an n-type layer.

The first insulating layer 104a implements a silicon dioxide layer. The first insulating layer 104a may be formed on the semiconductor layer 106. The first insulating layer 104a may be deposited via a process such as plasma-enhanced chemical vapor deposition (PECVD), sputtering, or atomic layer deposition (ALD). Other types of insulating material and/or fabrication techniques may be implemented to meet the design criteria of a particular application.

Figure 2:
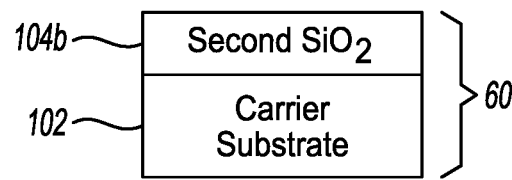
FIG. 2 is a schematic cross-sectional diagram of the initial stacked device and a handle device in accordance with one or more exemplary embodiments.

Referring to FIG. 2, a schematic cross-sectional diagram of an example initial stacked device 50 and a handle device 60 is shown in accordance with one or more exemplary embodiments. The initial stacked device 50 illustrated in FIG. 1 is rotated 180 degrees in FIG. 2 such that the sacrificial substrate 52 is shown at the top of the figure. The handle device 60 generally includes a carrier substrate 102 and a second insulating layer 104b.

The carrier substrate 102 implements a handle wafer. The carrier substrate 102 is formed of a semiconductor and is operational to provide mechanical support for the initial stacked device 50. In order to reduce issues caused by stress build-up and thermal expansion, the carrier substrate 102 may be a silicon carbide substrate. Other wafer materials, such as silicon, may be used for the carrier substrate 102.

The second insulating layer 104b implements another silicon dioxide layer. The second insulating layer 104b may be formed on the carrier substrate 102. After the carrier substrate 102 is cleaned, the second insulating layer 104b may be deposited via a process such as thermal oxidation, PECVD, sputtering, or ALD in preparation for wafer-bonding. Other types of insulating material and/or fabrication techniques may be implemented to meet the design criteria of a particular application. As illustrated in the figure, the initial stacked device 50 may be aligned with the handle device 60 with the first insulating layer 104a facing the second insulating layer 104b in preparation for the wafer bonding.

Figure 3:
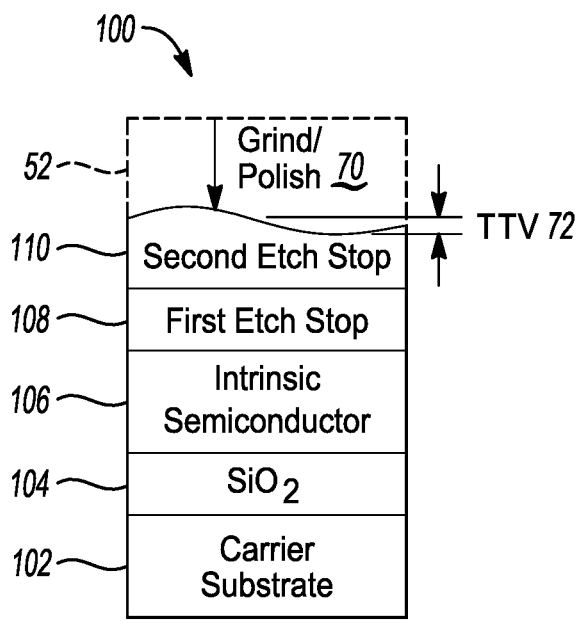
FIG. 3 is a schematic cross-sectional diagram of a workpiece in accordance with one or more exemplary embodiments.

Referring to FIG. 3, a schematic cross-sectional diagram of an example workpiece 100 is shown in accordance with one or more exemplary embodiments. The workpiece 100 is formed by wafer bonding the first insulating layer 104a to the second insulating layer 104b by common techniques (e.g., annealed at approximately 200 degrees Celsius) thereby forming an insulating layer 104. Thereafter, the sacrificial substrate 52 and an initial portion of the second etch stop layer 110 is removed 70 by a process of mechanical grinding and chemical-mechanical polishing. The grinding and polishing may add approximately 1 µm of total thickness variation. Therefore, the second etch stop layer 110 has a total thickness variation 72 of approximately 2 µm to approximately 4 µm.

Although the mechanical grinding and polishing may yield a locally smooth surface and uniform thickness over small length scales (e.g., ranging from micrometers to millimeters), the grinding usually yields non-uniform film thickness (compared to a sub-micron thick target film) across the wafer and may introduce new lattice defects, such as dislocations and crystal strain. Therefore, the mechanical grinding is stopped in the second etch stop layer, 110 leaving at least a few micrometers thickness above the first etch stop layer 108.

Figure 4:
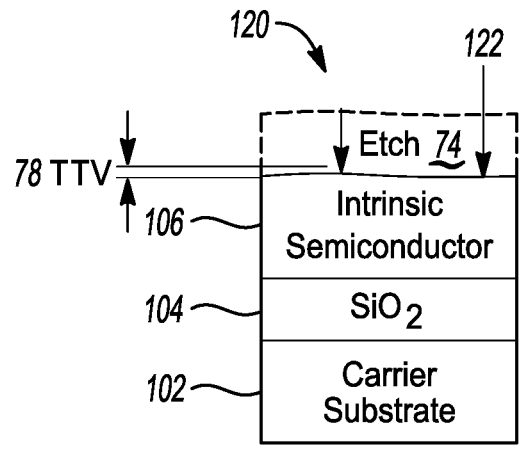
FIG. 4 is a schematic cross-sectional diagram of a semiconductor device in accordance with one or more exemplary embodiments.

Referring to FIG. 4, a schematic cross-sectional diagram of an example semiconductor device 120 is shown in accordance with one or more exemplary embodiments. In order to achieve a total thickness variation 78 of less than 10 nm over the whole wafer starting from a 4 µm total thickness surface variation, a greater than 400:1 selective etching 74 between the sacrificial layers (e.g., the second etch stop layer 110 and the first etch stop layer 108) and the semiconductor layer 106 is performed to produce optically accessible quantum devices. In contrast, a typical photo-electrochemical etching (PEC) dopant-type selective etch is generally less than 100:1. The selective etching generally leaves the semiconductor device 120 with an exposed, flat surface 122 on the semiconductor layer 106. The flat surface 122 is available for further processing.

Figure 5:
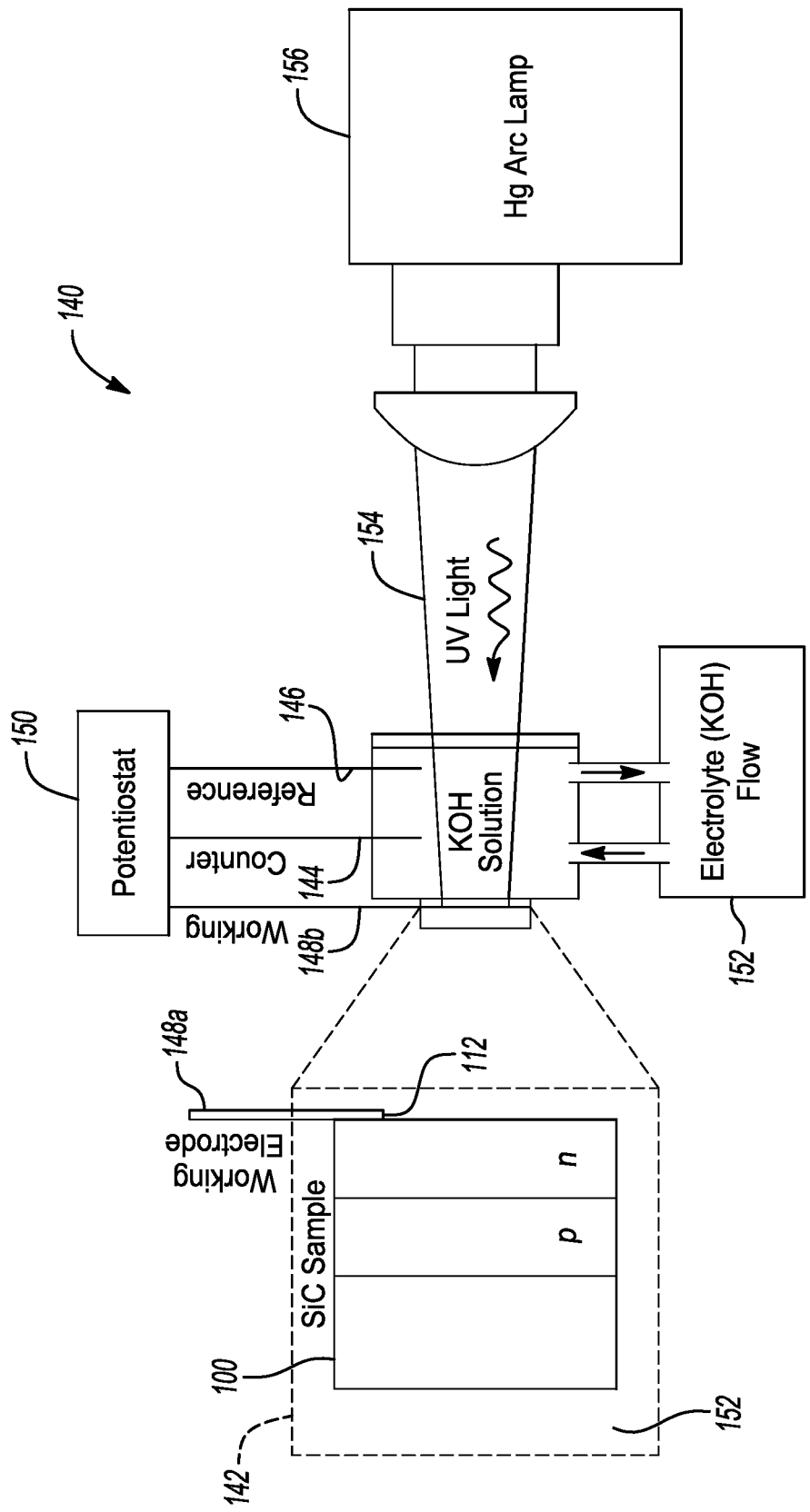
FIG. 5 is a schematic cross-sectional diagram of photo-electrochemical etching in accordance with one or more exemplary embodiments.

Referring to FIG. 5 with reference back to FIG. 4, a schematic cross-sectional diagram of an example photo-electrochemical etching 140 is shown in accordance with one or more exemplary embodiments. The example illustrates a three-electrode photo-electrochemical cell 142 using a Pt counter electrode 144, an Ag/AgCl reference electrode 146, and a pair of working electrodes 148a-148b coupled to a potentiostat 150. One of the working electrodes (e.g., 148a) may be electrically connected to a contact 112 formed on the top-most etch stop layer (e.g., the second etch stop layer 110) of the workpiece 100.

The workpiece 100 is immersed in a flowing aqueous potassium hydroxide electrolyte 152 (e.g., 1 wt %/0.18 M) or hydrofluoric acid in water and is illuminated by an ultraviolet light 154. The ultraviolet light 154 is generated by Mercury-xenon light source 156 fitted with a –01A type 365 nm filter and condenser lens converging the majority of the UV light 154 within a 1.27 cm diameter aperture (e.g., 1.3 cm$^2$). By using the photo-electrochemical etching (PEC) for doping-type selective etching (e.g., n-type vs p-type), the etch stop layers 108 and 110 are removed to expose the clean-crystalline, low-defect-density surface 122 of the semiconductor layer 106.

During the PEC etching, the workpiece 100 is illuminated with above-bandgap light. The ultraviolet light 154 generally has wavelengths shorter than 390 nm (e.g. Hg lamp) for the 4H—SiC due to the 4H—SiC having a bandgap of approximately 3.2 eV. A voltage bias is applied by the potentiostat 150 between the contact 112 on the workpiece 100 and the counter electrode 144 in the electrolyte 152. The photo-electrochemical process ensues oxidization of the silicon carbide surface by forming silicon oxide (SiOx), and carbon monoxide or dioxide (CO or $CO_2$). The SiOx dissolves into the electrolyte 152. The $CO/CO_2$ is a gas and dissolves into the electrolyte 152 and/or bubbles out of solution. The continuous removal of the oxidation products from the surface (e.g., via dissolution) of the 4H—SiC allows the reaction to continue resulting in an etching of the surface. A rate of photo-electrochemical oxidation of the surface is dependent upon the level and type of doping in the thin film (see FIG. 6). Under certain conditions, a selective etching rate may be established that results in the preferential etching of one dopant type over another (e.g., p-type, n-type, intrinsic). The etch selectivity is established by controlling the voltage bias with the potentiostat 150. The doping-type selectivity and the nature of the PEC etching (wet chemistry process) may be used to produce a silicon carbide-on-insulating thin film that is uniform and planar across the whole wafer.

Figure 6:
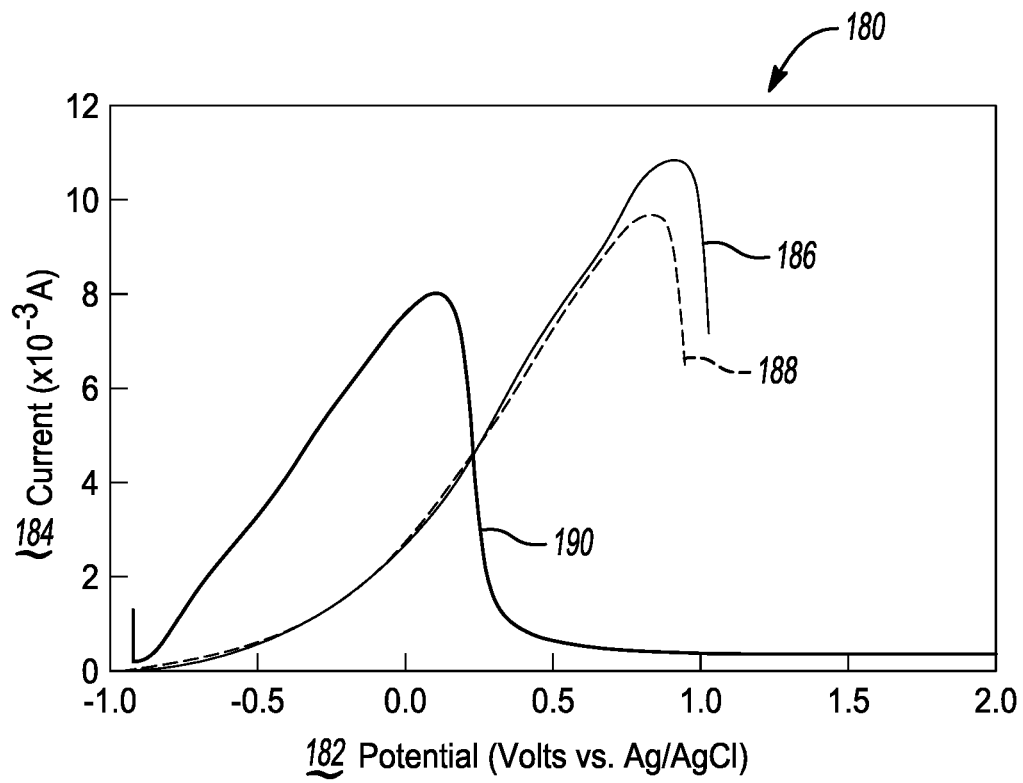
FIG. 6 is a graph of electrochemical measurements based on dopant type in accordance with one or more exemplary embodiments.

Referring to FIG. 6, a graph 180 of example selective etching electrochemistry measurement based on dopant type is shown in accordance with one or more exemplary embodiments. The graph 180 has an X-axis 182 and a Y-axis 184. The X-axis 182 represents a potential (e.g., volts vs Ag/AgCl) in units of volts (V). The Y-axis 184 represents an etch current in units of milliamperes. The difference in current response at an applied potential between n-type and p-type doping shows the basis for selective etching. The graph 180 shows selective etching of an n-type layer on top of a p-type layer. Current/voltage sweeps for a $5 \times 10^{18}$ $cm^{-3}$ n-doped layer (e.g., a first voltage curve 186 and a second voltage curve 188) and a $7 \times 10^{18}$ $cm^{-3}$ p-doped layer (e.g., a third voltage curve 190) in 1 wt % KOH at room temperature are illustrated.

Figure 7:
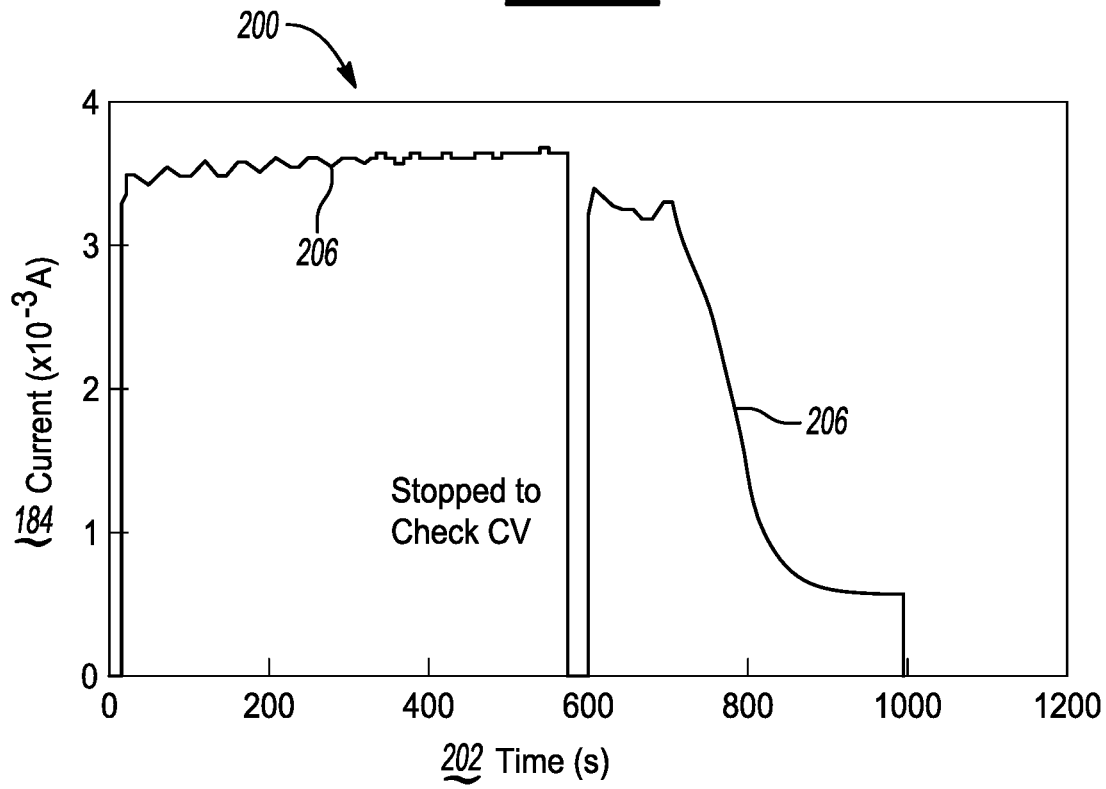
FIG. 7 is another graph of electrochemical measurements based on dopant type in accordance with one or more exemplary embodiments.

Referring to FIG. 7, a graph 200 of example selective etching based on dopant type is shown in accordance with one or more exemplary embodiments. The graph 200 has an X-axis 202 and the Y-axis 184. The X-axis 202 represents time in units of seconds. The Y-axis 184 represents the etch current in units of milliamperes. A curve 206 is an etch current. The example illustrates a constant voltage etching of the overlying n-layer through to the underlying p-type layer at 0.1 V vs. Ag/AgCl. The n-type layer is present (being etched) up to approximately 700 seconds. A transition in the etching occurs from n-type to p-type between 700 seconds to 900 seconds. Etching of the p-type layer continues beyond 900 seconds.

As shown in FIGS. 6 and 7, an initial current/voltage sweep using cyclic voltammetry (CV) shows an etch current peak at approximately 0.9 V with a steep current drop at higher voltages indicating surface passivation (FIG. 6, curve 186). Based on the curve 186, a constant voltage etching was performed at 0.1 V, which is 0.8 V below the peak. The etching voltage was chosen to ensure uniform etching without the influence of passivation. An etch current of 3.5 mA was obtained. At 580 seconds, the etching was paused and another cyclic voltammetry was acquired (FIG. 6, curve 188). The curve 188 nearly overlaps the initial curve 186 indicating that the n-type layer was still present. The etching was subsequently continued.

From approximately 700 seconds to approximately 900 seconds, the etch current decreased to 0.6 mA, a decrease of 6.2 times. After stopping the etch at 1000 seconds, a final cyclic voltammetry was acquired (FIG. 6, curve 190). The cyclic voltammetry shows a passivation peak etch current at 0.1 V indicating that the etching had proceeded through the n-type layer into the underlying p-type layer. Thus, the constant etch current etching of the n-type layer (0.8 V below the passivation peak) was performed right at the passivation voltage for the p-type layer. Although at the peak in the cyclic voltammetry, the cyclic voltammetry measurement is dynamic with an increasing voltage sweep. With a static voltage (as in the constant voltage etching), the peak etch current may be less stable and quickly passivates thereby reducing the etch current by a factor of 6.2 times. The difference between the etch current in the n-type layer (3.5 mA) and in the p-type layer (0.6 mA) indicates n/p selectivity in silicon carbide of approximately 6 times.

Figure 8:
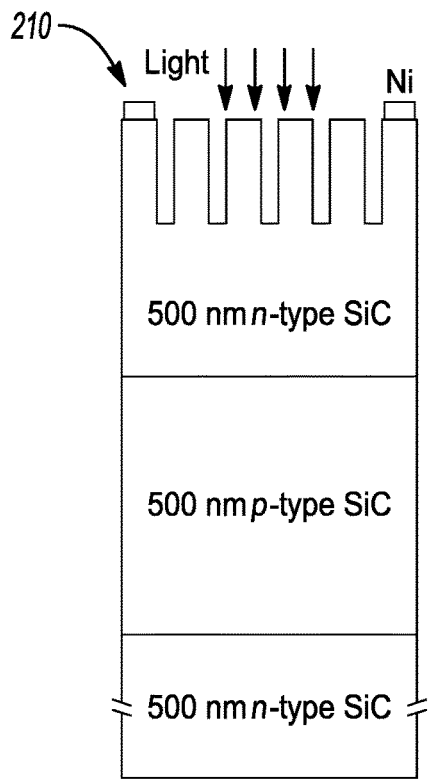
FIG. 8 is a schematic cross-sectional diagram of a n-p-n epitaxial sample with periodic height variation in accordance with one or more exemplary embodiments.

Referring to FIG. 8, a schematic cross-sectional diagram of an example n-p-n epitaxial sample 210 with periodic height variation is shown in accordance with one or more exemplary embodiments. The sample 210 was fabricated on a wafer with n-p-n layers grown on a bulk silicon carbide. An example initial cross-section of the sample 210 shows a surface n-type layer prepared with trenches 180 nm deep by 100 μm wide (not drawn to scale).

Figure 9:
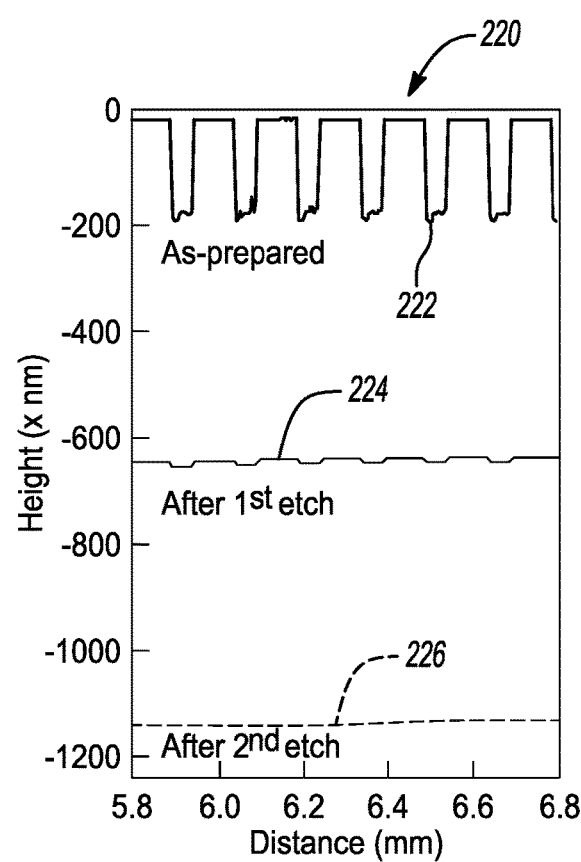
FIG. 9 is a graph of profilometry measurements of the sample in FIG. 8 in accordance with one or more exemplary embodiments.

Referring to FIG. 9, a graph 220 of example profilometry measurements of the sample 210 in FIG. 8 is shown in accordance with one or more exemplary embodiments. A curve 222 shows a height of the sample 210 after the initial trenches were formed. A curve 224 shows the height of the sample 210 after a first etch that removes the top n-type layer and a portion of the middle p-type layer. A curve 226 shows the height of the sample 210 after a second etch that removed the middle p-type layer and a portion of the bottom n-type layer.

Figure 10:
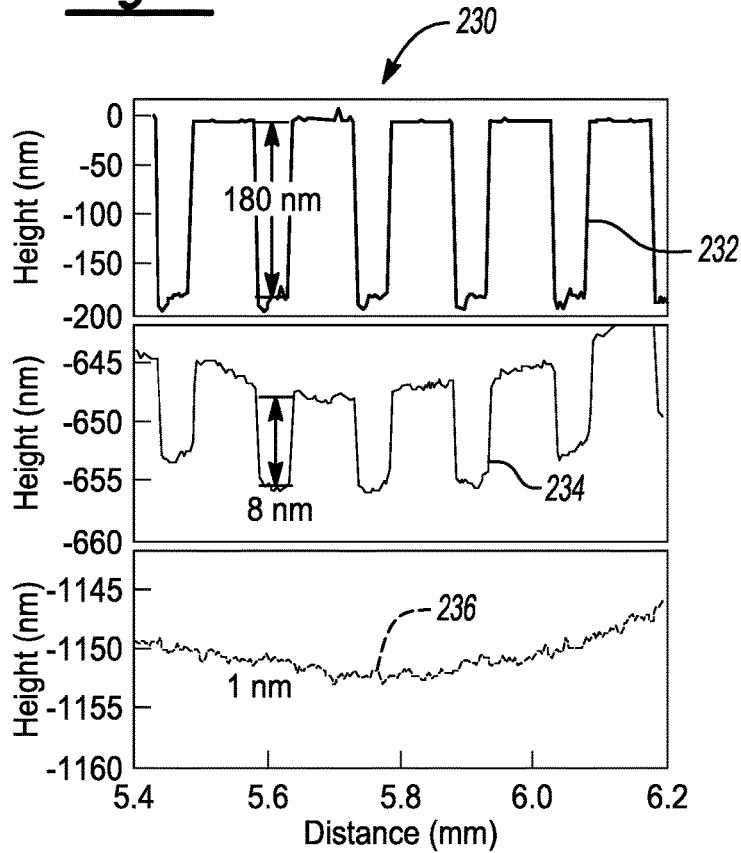
FIG. 10 is a graph of the profilometry measurements rescaled from FIG. 9 in accordance with one or more exemplary embodiments.

Referring to FIG. 10 with reference back to FIG. 9, a graph 230 of the example profilometry measurements rescaled from graph 220 is shown in accordance with one or more exemplary embodiments. A curve 232 shows the curve 222 expanded for more detail. A curve 234 shows the curve 224 expanded for more detail. A curve 236 shows the curve 226 expanded for more detail.

The initial surface exhibits trench heights of 180 nm (curve 232), which are reduced to 8 nm after etching the top n-type layer (V=0.37 V) resulting in the removal of approximately 650 nm silicon carbide on average (curve 234). After etching the p-type layer (V=−0.75 V) resulting in the removal of another approximately 500 nm, the trenches were no longer clearly visible (curve 226) with a nanometer scale height variation (curve 236).

In FIGS. 8-10, the trenched sample 210 was selectively PEC etched using a linear sweep voltammetry (LSV) and a chronoamperometry (CA). Initial LSV measurements on the n-type surface layer showed an oxidation peak at approximately 0.47 volts. The first PEC etch on the trenched n-type surface was performed at 0.37 volts, 0.1 volts below the n-type peak. The CA showed an initial etch current of approximately 7.5 mA, which dropped slowly to approximately 6 mA over approximately 2.5 Coulombs (C) of charge transfer over approximately 500 seconds. A reduction in the etch current was expected as the etching at the bottom of the trenches transitioned into the p-type layer. After approximately 2.6 Coulombs of total charge transfer, the etch current dropped off and levels to approximately 0.2 mA indicating a complete transition into the p-type layer. At 0.37 volts, the etch current measured on the n-type surface was approximately 37 times larger than that measured on the p-type layer. Surface profilometry (shown in the curves 224 and 234) reveals a reduction in step height from 180 nm down to approximately 8 nm, yielding a selectivity of about 22:1. The curvature (long-range surface variation) evident in the curves 234 and 236 is associated with wafer bow, which is present in the as-prepared wafer and is not attributed to additional surface variation introduced by the PEC.

Referring to FIG. 11, a schematic cross-sectional diagram of an example total thickness variation reduction using alternating n-type and p-type layers is shown in accordance with one or more exemplary embodiments. In the example, an initial silicon carbide stack 240a generally includes of a top n-type third etch layer 242 that has been bonded, ground, and polished resulting in a maximum thickness of 6 μm and a minimum thickness of 1 μm, giving a total thickness variation of 5 μm. Below the third etch layer 242 is a 1 μm thick p-type second etch stop layer 244a, a 1 μm n-type first etch stop layer 246a, and a bottom p-type semiconductor layer 248a. Below the layer 248a may be the insulating layer 104 (e.g., an insulating $SiO_2$ layer) on top of the carrier substrate 102 (see FIG. 4). A minimum thickness (t) of the etch stop layers is determined by the initial total thickness variation and the selectivity(s) so that t≥TTV/second. PEC etching on the silicon carbide stack 240a is performed at a bias voltage where the etching of n-type silicon carbide has a 10:1 selectivity, indicating that n-type etching occurs at a rate 10 times greater than that of the adjoining p-type below.

In the example, an initial etching results in the removal of the 6 μm of the third etch layer 242 from the surface along with some of the underlying second layer 244a, leaving a shortened silicon carbide stack 240b. After the initial etching, a surface of the shortened silicon carbide stack 240b is in the p-type second etch stop layer 244b (the third etch stop layer 242 is removed) with a total thickness variation of 500 nm (a factor of 10 times reduction in the total thickness variation from the initial silicon carbide stack 240a). The second etch stop layer 244b has a maximum thickness of 2 μm and a minimum thickness of 0.2 μm.

Another etching is performed again on the shortened silicon carbide stack 240b to create a shorter silicon carbide stack 240c. Now the etching is performed with bias voltage of approximately-0.5V vs. Ag/AgCl, where the etching of p-type silicon carbide in the second layer 244b has a 10:1 selectivity, indicating that p-type etching occurs at a rate of 10 times greater than that of the n-type first etch stop layer 246a beneath. The duration of the etching is sufficient to remove the maximum 1 μm thickness of the p-type second etch stop layer 244b and a portion of the n-type first etch stop layer 246a. The resulting surface of the shorter silicon carbide stack 240c is a first etch stop layer 246b with a 50 nm total thickness variation (a 100 times reduction in the total thickness variation from the initial silicon carbide stack 240a). The first etch stop layer 246b has a maximum thickness of 2 μm and a minimum thickness of 200 nm.

A subsequent etching is performed on the short silicon carbide stack 240c to generate a final silicon carbide stack 240d. The etching is performed at a voltage that removes the n-type first etch stop layer 246b and a portion of the bottom p-type semiconductor layer 248a. The partially etched semiconductor layer 248b has in a final total thickness variation of 5 nm total thickness variation (a 1000 times reduction in total thickness variation from the initial silicon carbide stack 240a).

Referring to FIG. 12, a schematic cross-sectional diagram of an example total thickness variation reduction using sacrificial etch layers with variable thickness is shown in accordance with one or more exemplary embodiments. In the example, an initial silicon carbide stack 260a includes of a top n-type third etch stop layer 262 that has been bonded, ground, and polished resulting in a maximum thickness of 6 μm and a minimum thickness of 1 μm, giving a total thickness variation of 5 μm. The other etch stop layers have decreasing thickness (from top to bottom) so that the total thickness variation is reduced as the etching proceeds through the different etch stop layers. Below the top n-type third etch stop layer 262 is a 500 nm thick p-type second etch stop layer 264a, followed by a 50 nm thick n-type first etch stop layer 266a, and followed by a 1 μm thick undoped semiconductor layer 268a.

An initial etching on the initial silicon carbide stack 260a creates a shorter silicon carbide stack 260b. The initial etching is performed at a bias voltage of approximately 0.4 V (vs. Ag/AgCl), where the etching of n-type silicon carbide has a 10:1 selectivity, indicating that n-type etching occurs at a rate 10 times greater than that of the p-type below. The initial etching results in the removal of the 6 μm of the third etch stop layer 262 from the surface (in a thickest region of the third layer 262) along with some of the underlying p-type second etch stop layer 264a (in a thinnest region of the third layer 262). After the initial etching, the surface of the shorter silicon carbide stack 260b is in the p-type second etch stop layer 264b (the third etch stop layer 262 having been removed) with a total thickness variation of 500 nm (a 10 times reduction in total thickness variation from the initial silicon carbide stack 260a) with a maximum thickness of 500 nm and a thinnest region of the p-type second etch stop layer 264b may be completely removed exposing the underlying n-type first etch stop layer 266a.

Another etching is performed on the shortened silicon carbide stack 260b to generate a short silicon carbide stack 260c. The etching is performed at a bias voltage of −0.8 V (vs. Ag/AgCl), where the etching of p-type silicon carbide has a 10:1 selectivity, indicating that p-type etching occurs at a rate 10 times greater than that of the n-type silicon carbide below. The duration of the etching is sufficient to remove the maximum of 500 nm of the second etch stop layer 264b from the surface. The resulting surface of the short silicon carbide stack 260c is in the n-type first etch stop layer 266b with a 50 nm total thickness variation (a 100 times reduction in total thickness variation from the initial silicon carbide stack 260a) with a maximum thickness of 50 nm and a thinnest region the first etch stop layer 266b may possibly be completely removed exposing the underlying undoped semiconductor layer 268a.

Another etching is performed on the short silicon carbide stack 260c to create a final silicon carbide stack 260d. The etching is performed again at a voltage of approximately 0.4 volts (vs. Ag/AgCl), which removes the first etch stop layer 266b and results in a final total thickness variation of 5 nm in the semiconductor layer 268b (a 1000 times reduction in total thickness variation from the initial silicon carbide stack 260a).

Figure 13:
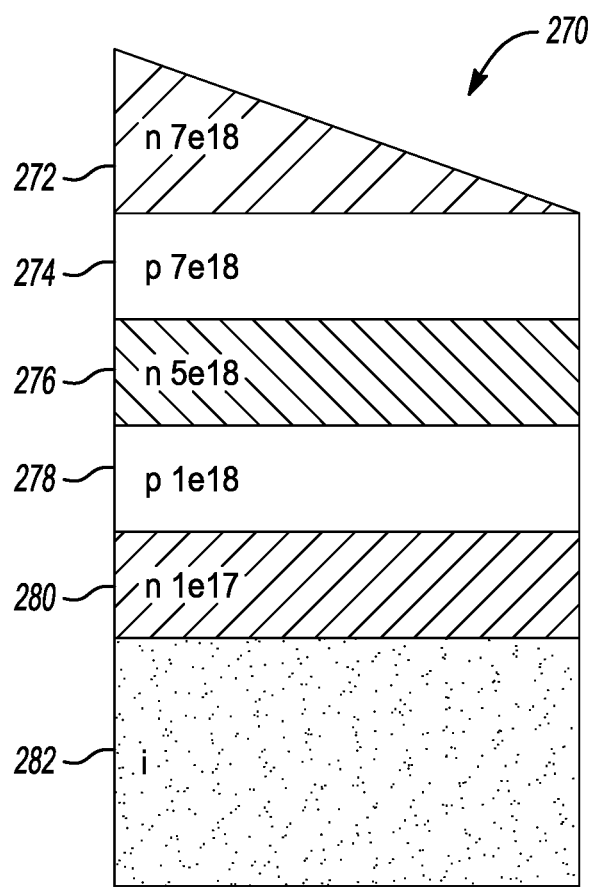
FIG. 13 is a schematic cross-sectional diagram of total thickness variation reduction using decreasing dopant concentrations in accordance with one or more exemplary embodiments.

Referring to FIG. 13, a schematic cross-sectional diagram of an example total thickness variation reduction using decreasing dopant concentrations is shown in accordance with one or more exemplary embodiments. A concern is that high density doping layers near to an unintentionally doped layer may negatively affect spin defects or other quantum emitters. Point defects in silicon carbide are created by electron irradiation of the sample followed by high temperature anneal at 850 C for 1 hour to form divacancy defects (temperatures between 800-1000 C may also work). At such high temperatures and long times, the dopants may migrate close to the defects, therefore decreasing spin lifetimes or change the interfaces and etch selectivity. Therefore, higher doping layers further apart from the undoped region may be beneficial. For example, an initial silicon carbide stack 270 may have a top n-type fifth etch stop layer 272, a p-type fourth etch stop layer 274, another n-type third etch stop layer 276, another p-type second etch stop layer 278, yet another n-type first layer 280, and an intrinsic layer 282. The etch stop layer 272-280 may have decreasing dopant concentrations. By way of example, the etch stop layers 272-280 may have dopant concentrations of $7\times10^{19}$ cm$^{-3}$, $7\times10^{18}$ cm$^{-3}$, $5\times10^{18}$ cm$^{-3}$, $1\times10^{18}$ cm$^{-3}$, and $1\times10^{17}$ cm$^{-3}$, respectively. The intrinsic layer 282 with spin defects may initially be more than 500 nm to 20 μm thick. After a PEC etching that removes at least one of the doped etch stop layers 272-280, the silicon carbide may be non-selectively etched with an inductively coupled plasma to thin the wafer uniformly down to the thickness appropriate for photonic device operation.

Figure 14:
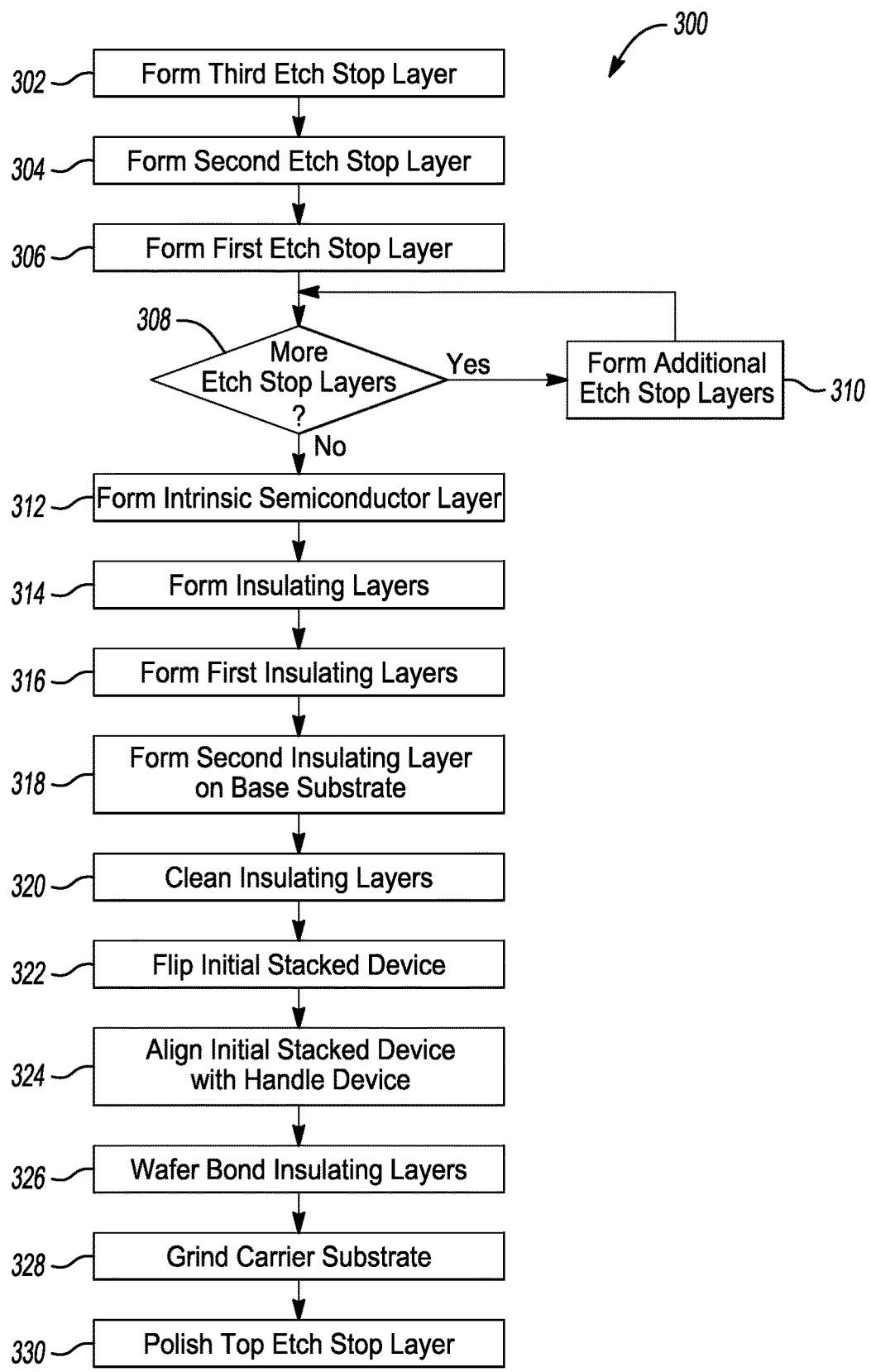
FIG. 14 is a flow diagram of a method for forming the workpiece in accordance with one or more exemplary embodiments.

Referring to FIG. 14 with reference back to FIGS. 1-4 and 11, a flow diagram of an example method 300 for forming the workpiece 100 is shown in accordance with one or more exemplary embodiments. The method 300 may be performed with standard semiconductor fabrication techniques. The method (or process) 300 generally includes steps 302 to 330, as illustrated. The sequence of steps is shown as a representative example. Other step orders may be implemented to meet the criteria of a particular application.

In the step 302, an optional third etch stop layer (e.g., FIG. 11, layer 242) may be formed as a third silicon carbide layer with a third doping type, a third doping concentration and/or a third thickness on the second etch stop layer (e.g., FIG. 11, layer 244a). The second etch stop layer 244a is formed in the step 304 as a second silicon carbide layer with a second doping type, a second doping concentration and/or a second thickness on the first etch stop layer. A first etch stop layer (e.g., FIG. 11, layer 246a) is formed in the step 306 as a first silicon carbide layer with a first doping type, a first doping concentration, and/or a first thickness on the semiconductor layer. A check may be performed in the step 308 for more etch stop layers. If more etch stop layers should be present, additional etch stop layers may be formed in the step 310.

In the step 312, the semiconductor layer (e.g., FIG. 1, layer 106) is formed on the exposed etch stop layer 246a. The semiconductor layer 248a is considered a working silicon carbide layer on/in which the MEMS devices and/or quantum devices are created. One or more insulating layers are formed on the semiconductor layer 106 in the step 314. The one or more insulating layers may include forming a first insulating layer (e.g., FIG. 1, layer 104a) on the top etch stop layer in the step 316.

In the step 318, a second insulating layer (e.g., FIG. 1, layer 104b) is formed on a base substrate (e.g., FIG. 1, substrate 102). The first insulating layer 104a and the second insulating layer 104b are cleaned in the step 320. The initial stacked device (e.g., FIG. 2, device 50) is flipped 180 degrees in the step 322 and aligned with the handle device (e.g., FIG. 2, device 60) in the step 324.

A wafer bonding is performed in the step 326 to bind the first insulating layer 104a to the second insulating layer 104b to create the combined insulating layer 104. In the step 328, the sacrificial substrate 52 and part of the top etch stop layer (e.g., the third etch stop layer or the second etch stop layer) is removed by mechanical grinding. In the step 330, the now exposed surface of the top etch stop layer is polished in preparation for the photo-electrochemical etching process.

Figure 15:
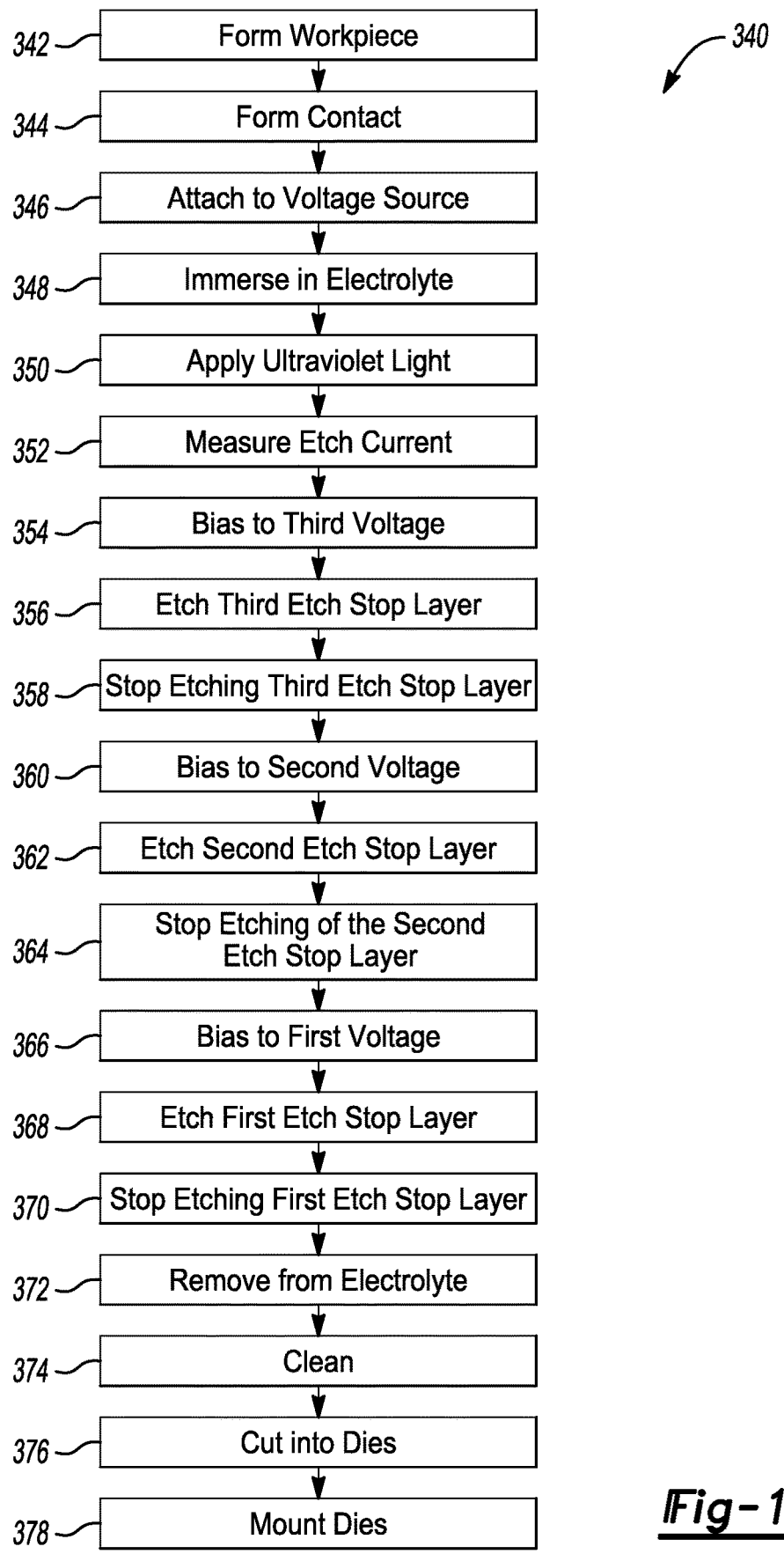
FIG. 15 is a flow diagram of a method for producing a planar semiconductor surface in accordance with one or more exemplary embodiments.

Referring to FIG. 15 with references to FIGS. 4, 5, 11 and 14, a flow diagram of an example method 340 for producing a planar semiconductor surface is shown in accordance with one or more exemplary embodiments. The method 340 may be performed with standard semiconductor fabrication techniques. The method (or process) 340 generally includes steps 342 to 378, as illustrated. The sequence of steps is shown as a representative example. Other step orders may be implemented to meet the criteria of a particular application.

In the step 342, the workpiece 100 is formed (see method 300 in FIG. 14). A contact (e.g., FIG. 5, 112) is formed on the workpiece 100 in the step 344. The workpiece is attached to a voltage source (e.g., FIG. 5, potentiostat 150) in the step 346 and the surface is immersed in the electrolyte (e.g., FIG. 5, 152) in the step 348. The contact 112 is positioned to be out of the electrolyte 152. The ultraviolet light (e.g., FIG. 5, 154) is applied to the workpiece 100 in the step 350.

In the step 352, an etch current is measured through the contact 112 during photo-electrochemical etching. The workpiece 100 is biased in the step 354 to a third voltage through the contact 112, where the bias voltage used in the photo-electrochemical etching to less than 0.2 volts from a peak voltage at which a peak current is measured through the contact 112.

The third etch stop layer (e.g., FIG. 11, layer 242, if present) and part of the second etch stop layer (e.g., FIG. 11, layer 244a) are etched in the step 356 with the photo-electrochemical etching and the third voltage. The third voltage selectively removes the third etch stop layer 242 faster than the second etch stop layer 244a until the second etch stop layer 244a is passivated and stops etching. In the step 358, the etching of the third etch stop layer 242 is stopped in response to a drop in the etch current. The etch current drops in response to etching through the third etch stop layer 242.

The workpiece 100 is based to a second voltage through the contact in the step 360, where the second voltage is different than the third voltage. The second etch stop layer 244a and part of the first etch stop layer 246a is etched in the step 362 with the photo-electrochemical etching and the second voltage. The second voltage selectively removes the second etch stop layer 244a faster than the first etch stop layer 246a until the first etch stop layer 246a is passivated and stops etching. The etching of the second etch stop layer 244a is stopped in the step 364 in response to a drop in the etch current. The etch current drops in response to etching through the second etch stop layer 244a.

In the step 366, the workpiece 100 is biased to a first voltage through the contact 112, where the first voltage is different than the second voltage. The first etch stop layer 246a and part of the semiconductor layer 248a is etched in the step 368 with the photo-electrochemical etching and the first voltage. The first voltage selectively removes the first etch stop layer faster 246a than the semiconductor layer 248a until the semiconductor layer 248a is passivated and stops etching.

In the step 370, the etching of the first etch stop layer 246a is stopped in response to a drop in the etch current to produce a semiconductor device (e.g., FIG. 4, device 120) with a planar surface (e.g., FIG. 4, surface 122) on the semiconductor layer 248a (e.g., FIG. 4, layer 106). The etch current drops in response to etching through the first etch stop layer 246a. The semiconductor device 120 is removed from the electrolyte 152 in the step 372 and cleaned in the step 374.

If the semiconductor device 120 is still part of a wafer, the wafer may be cut into individual dies in the step 376 and mounted to carriers in the step 378.

Embodiments of the disclosure generally provide a method for forming a semiconductor structure and/or semiconductor device. The method includes forming multiple doped layers on a silicon carbide substrate. The doped layers have doping levels such that some doped layers are etched using a photo-electrochemical etching process while other portions of the doped layers remain unetched, forming a first oxide layer on the doped layers, bonding the first oxide layer to a second oxide layer on a carrier substrate to form an oxide layer located between the carrier substrate and the doped layers, grinding the silicon carbide substrate, stopping the grinding when a part of a top doped layer is reached, etching the top doped layer using the photo-electrochemical etching process such that the top doped layer is removed and a middle doped layer remains, and the middle doped layer is exposed. Thereafter, the middle doped layer is etched using the photo-electrochemical etching process such that the middle doped layer is removed and a lower doped layer remains and is exposed. The lower doped layer includes the smooth surface of the semiconductor device.

The photo-electrochemical etching process utilizes an ultraviolet (UV) light source, an electrolyte solution, and physical and electrical contact between semiconductor and the electrolyte solution. The UV light source may be a mercury arc lamp. The electrolyte solution may be an aqueous potassium hydroxide, aqueous hydrogen fluoride, or aqueous hydrogen chloride. The semiconductor may have an exposed C-type surface with alternating doping types, of at least 3 layers, such as n-type, p-type, n-type, p-type. The doping layers generally have doping concentration that vary from $1\times10^{17}$ cm$^{-3}$ to $1\times10^{19}$ cm$^{-3}$. The doping concentration in each layer may either be the same, or the doping concentration may vary among the layers. The doping layers may have thicknesses varying from approximately 10 nm to approximately 10 micrometers.

The photo-electrochemical etching method selectively etches n-type silicon carbide, such that the substrate bias is at a voltage that is higher than the peak etch current for p-type doped layer, and the p-type layer is passivated and no longer etches. The photo-electrochemical etching is held at different biases such that selective etching of n-type and p-type materials may be alternated once the measured etch current drops, indicating a new doping layer has been reached. The photo-electrochemical etch varies with time to adjust an etch rate through each doped layer. The photo-electrochemical etching is held at a bias of <0.2 volts from the voltage at which the peak etch current is measured.

The silicon carbide-on-insulator thin films (≤1 μm thickness) are generally applicable to various companies and/or industries working on nonlinear optical materials beyond silicon and silicon nitride. In addition, embodiments of the disclosure provide a wafer-scale fabrication method for applications or product lines utilizing ultra-pure crystals (e.g., low point defect densities where ion-slicing and grinding-only are not good options) of silicon carbide. Examples include, but are not limited to, integrated photonics with wide bandgap crystalline semiconductors and high-power electronics implementing thin film doped heterostructures with complex in-plane patterning, and complex out-of-plane patterning.

As explained above and reiterated below, the present disclosure includes, without limitation, the following example implementations.

Clause 1. A method for producing a planar semiconductor surface, the method comprising: forming a workpiece that has a carrier substrate, one or more insulating layers on the carrier substrate, a semiconductor layer on the one or more insulating layers, a first etch stop layer on the semiconductor layer, and a second etch stop layer on the first etch stop layer; forming a contact on the workpiece; biasing the workpiece to a second voltage through the contact; etching the second etch stop layer and part of the first etch stop layer with a photo-electrochemical etching and the second voltage that selectively removes the second etch stop layer faster than the first etch stop layer; biasing the workpiece to a first voltage through the contact, wherein the first voltage is different than the second voltage; and etching the first etch stop layer and part of the semiconductor layer with the photo-electrochemical etching and the first voltage that selectively removes the first etch stop layer faster than the semiconductor layer to produce a semiconductor device with a planar surface on the semiconductor layer.

Clause 2. The method according to clause 1, wherein the workpiece has a third etch stop layer on the second etch stop layer, the method further comprising: biasing the workpiece to a third voltage through the contact, wherein the third voltage is different than the second voltage; and etching the third etch stop layer and part of the second etch stop layer with the photo-electrochemical etching and the third voltage that selectively removes the third etch stop layer faster than the second etch stop layer.

Clause 3. The method according to clause 1 or clause 2, wherein the semiconductor layer is an intrinsic layer.

Clause 4. The method according to clause 3, further comprising: forming the semiconductor layer on the first etch stop layer.

Clause 5. The method according to clause 1 or clause 2, further comprising: forming the first etch stop layer with a first doping type; and forming the second etch stop layer with a second doping type, wherein the first doping type is different than the second doping type.

Clause 6. The method according to clause 5, further comprising: forming the first etch stop layer with a first doping concentration; and forming the second etch stop layer with a second doping concentration, wherein the second doping concentration is lower than the first doping concentration.

Clause 7. The method according to clause 6, wherein the first doping concentration and the second doping concentration are in a range of approximately $1\times10^{18}$ dopants per cubic centimeters to approximately $1\times10^{17}$ dopants per cubic centimeters.

Clause 8. The method according to clause 1 or clause 2, further comprising: forming the first etch stop layer with a first thickness; and forming the second etch stop layer with a second thickness, wherein the second thickness is greater than the first thickness.

Clause 9. The method according to clause 8, wherein the first thickness and the second thickness are in a range of approximately 10 nanometers to approximately 10 micrometers.

Clause 10. The method according to clause 1 or clause 2, further comprising: measuring an etch current through the contact during the photo-electrochemical etching.

Clause 11. The method according to clause 10, further comprising: setting a bias voltage used in the photo-electrochemical etching to less than 0.2 volts from a peak voltage at which a peak etch current is measured through the contact.

Clause 12. The method according to clause 10, wherein the second etch stop layer is an n-type silicon carbide, the first etch stop layer is a p-type silicon carbide, and the second voltage used in the photo-electrochemical etching is higher than a peak voltage that creates a peak etch current for the p-type silicon carbide such that the p-type silicon carbide is passivated and stops etching.

Clause 13. The method according to clause 10, wherein the etch current drops in response to etching through the second etch stop layer.

Clause 14. The method according to clause 1 or clause 2, wherein the planar surface on the semiconductor layer varies by no greater than 10 nanometers over a 100 millimeter diameter wafer.

Clause 15. The method according to clause 1 or clause 2, further comprising: forming the workpiece on a sacrificial substrate.

Clause 16. The method according to clause 15, further comprising: removing the sacrificial substrate before the forming of the contact.

Clause 17. A semiconductor device with a planar surface fabricated in accordance with forming a workpiece that has a carrier substrate, one or more insulating layers on the carrier substrate, a semiconductor layer on the one or more insulating layers, a first etch stop layer on the semiconductor layer, and a second etch stop layer on the first etch stop layer; forming a contact on the workpiece; biasing the workpiece to a second voltage through the contact; etching the second etch stop layer and part of the first etch stop layer with a photo-electrochemical etching and the second voltage that selectively removes the second etch stop layer faster than the first etch stop layer; biasing the workpiece to a first voltage through the contact, wherein the first voltage is different than the second voltage; and etching the first etch stop layer and part of the semiconductor layer with the photo-electrochemical etching and the first voltage that selectively removes the first etch stop layer faster than the semiconductor layer to produce a semiconductor device with a planar surface on the semiconductor layer.

Clause 18. A method for producing a planar semiconductor surface, the method comprising: forming a workpiece that has a carrier substrate, a semiconductor layer, a first etch stop layer on the semiconductor layer, a second etch stop layer on the first etch stop layer, and a sacrificial substrate on the second etch stop layer; removing the sacrificial substrate; forming a contact on the workpiece after the sacrificial substrate has been removed; biasing the workpiece to a second voltage through the contact; etching the second etch stop layer and part of the first etch stop layer with a photo-electrochemical etching and the second voltage that selectively removes the second etch stop layer faster than the first etch stop layer; biasing the workpiece to a first voltage through the contact, wherein the first voltage is different than the second voltage; and etching the first etch stop layer and part of the semiconductor layer with the photo-electrochemical etching and the first voltage that selectively removes the first etch stop layer faster than the semiconductor layer to produce a semiconductor device with a planar surface on the semiconductor layer.

Clause 19. The method according to clause 18, further comprising: forming the semiconductor layer on the first etch stop layer.

Clause 20. The method according to clause 18 or clause 19, further comprising: forming the first etch stop layer with a first doping type; and forming the second etch stop layer with a second doping type, wherein the first doping type is different than the second doping type.

This disclosure is susceptible of embodiments in many different forms. Representative embodiments of the disclosure are shown in the drawings and are herein described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A method for producing a planar semiconductor surface, the method comprising:
   forming a workpiece that has a carrier substrate, one or more insulating layers on the carrier substrate, a semiconductor layer on the one or more insulating layers, a first etch stop layer on the semiconductor layer, and a second etch stop layer on the first etch stop layer;
   forming a contact on the workpiece;
   biasing the workpiece to a second voltage through the contact;
   etching the second etch stop layer and part of the first etch stop layer with a photo-electrochemical etching and the second voltage that selectively removes the second etch stop layer faster than the first etch stop layer;
   biasing the workpiece to a first voltage through the contact, wherein the first voltage is different than the second voltage; and
   etching the first etch stop layer and part of the semiconductor layer with the photo-electrochemical etching and the first voltage that selectively removes the first etch stop layer faster than the semiconductor layer to produce a semiconductor device with a planar surface on the semiconductor layer, wherein the first etch stop layer has a first doping type, and the second etch stop layer has a second doping type that is different than the first doping type.

2. The method according to claim 1, wherein the workpiece has a third etch stop layer on the second etch stop layer, the method further comprising:
biasing the workpiece to a third voltage through the contact, wherein the third voltage is different than the second voltage; and
etching the third etch stop layer and part of the second etch stop layer with the photo-electrochemical etching and the third voltage that selectively removes the third etch stop layer faster than the second etch stop layer.

3. The method according to claim 1, wherein the semiconductor layer is an intrinsic layer.

4. The method according to claim 3, further comprising:
forming the semiconductor layer on the first etch stop layer.

5. The method according to claim 1, wherein:
the first etch stop layer has a first doping concentration; and
the second etch stop layer has a second doping concentration, wherein the second doping concentration is lower than the first doping concentration.

6. The method according to claim 5, wherein the first doping concentration and the second doping concentration are in a range of approximately $1\times10^{18}$ dopants per cubic centimeters to approximately $1\times10^{17}$ dopants per cubic centimeters.

7. The method according to claim 1, wherein:
the first etch stop layer has a first thickness; and
the second etch stop layer has a second thickness, wherein the second thickness is greater than the first thickness.

8. The method according to claim 7, wherein the first thickness and the second thickness are in a range of approximately 10 nanometers to approximately 10 micrometers.

9. The method according to claim 1, further comprising:
measuring an etch current through the contact during the photo-electrochemical etching.

10. The method according to claim 9, further comprising:
setting a bias voltage used in the photo-electrochemical etching to less than 0.2 volts from a peak voltage at which a peak etch current is measured through the contact.

11. The method according to claim 9, wherein the second etch stop layer is an n-type silicon carbide, the first etch stop layer is a p-type silicon carbide, and the second voltage used in the photo-electrochemical etching is higher than a peak voltage that creates a peak etch current for the p-type silicon carbide such that the p-type silicon carbide is passivated and stops etching.

12. The method according to claim 9, wherein the etch current drops in response to etching through the second etch stop layer.

13. The method according to claim 1, wherein the planar surface on the semiconductor layer varies by no greater than 10 nanometers over a 100 millimeter diameter wafer.

14. The method according to claim 1, further comprising:
forming the workpiece on a sacrificial substrate.

15. The method according to claim 14, further comprising:
removing the sacrificial substrate before the forming of the contact.

16. A semiconductor device with a planar surface fabricated in accordance with claim 1.

17. A method for producing a planar semiconductor surface, the method comprising:
forming a workpiece that has a carrier substrate, a semiconductor layer, a first etch stop layer on the semiconductor layer, a second etch stop layer on the first etch stop layer, and a sacrificial substrate on the second etch stop layer;
removing the sacrificial substrate;
forming a contact on the workpiece after the sacrificial substrate has been removed;
biasing the workpiece to a second voltage through the contact;
etching the second etch stop layer and part of the first etch stop layer with a photo-electrochemical etching and the second voltage that selectively removes the second etch stop layer faster than the first etch stop layer;
biasing the workpiece to a first voltage through the contact, wherein the first voltage is different than the second voltage; and
etching the first etch stop layer and part of the semiconductor layer with the photo-electrochemical etching and the first voltage that selectively removes the first etch stop layer faster than the semiconductor layer to produce a semiconductor device with a planar surface on the semiconductor layer.

18. The method according to claim 17, further comprising:
forming the semiconductor layer on the first etch stop layer.

19. The method according to claim 17, further comprising:
forming the first etch stop layer with a first doping type; and
forming the second etch stop layer with a second doping type, wherein the first doping type is different than the second doping type.

20. The method according to claim 1, wherein:
the first etch stop layer is doped with a p-type dopant, and the second etch stop layer is doped with an n-type dopant.

* * * * *